United States Patent
Chen et al.

(10) Patent No.: US 7,705,670 B2
(45) Date of Patent: Apr. 27, 2010

(54) WIDE-RANGE AND HIGH-RESOLUTION PROGRAMMABLE GAIN AMPLIFIER

(75) Inventors: Hung-Wei Chen, Taipei (TW); Po-Yin Chao, Taipei (TW)

(73) Assignee: Hycon Technology Corp., Taipei County (TW)

( * ) Notice: Subject to any disclaimer, the term of this patent is extended or adjusted under 35 U.S.C. 154(b) by 56 days.

(21) Appl. No.: 12/232,353

(22) Filed: Sep. 16, 2008

(65) Prior Publication Data

US 2010/0066444 A1  Mar. 18, 2010

(51) Int. Cl.
*H03F 1/02* (2006.01)
(52) U.S. Cl. .......................................... 330/9; 327/124
(58) Field of Classification Search .............. 330/9; 327/124, 307

See application file for complete search history.

(56) References Cited

U.S. PATENT DOCUMENTS

| 4,801,888 | A  | * | 1/1989 | Haque ............................ 330/9 |
| 6,097,248 | A  | * | 8/2000 | Segami .......................... 330/9 |
| 6,768,374 | B1 | * | 7/2004 | Lee ................................ 330/9 |
| 6,940,348 | B2 | * | 9/2005 | Confalonieri et al. ......... 330/69 |
| 7,518,440 | B1 | * | 4/2009 | Trifonov ........................ 330/9 |

* cited by examiner

*Primary Examiner*—Henry K Choe
(74) *Attorney, Agent, or Firm*—Bacon & Thomas, PLLC (57) ABSTRACT

A first gain stage and a second gain stage having different gains are linked in cascade to construct a wide range and high resolution programmable gain amplifier. The second gain stage can be used only for low gain and low power consumption. Furthermore, two pairs of chopper circuits are used to shift flicker noise when the programmable gain amplifier is operated.

12 Claims, 8 Drawing Sheets

WIDE-RANGE AND HIGH-RESOLUTION PROGRAMMABLE GAIN AMPLIFIER

FIELD OF THE INVENTION

The present invention relates generally to a programmable gain amplifier. More specifically, the present invention relates to a wide-range and high-resolution programmable gain amplifier.

BACKGROUND OF THE INVENTION

In modern communication receiver, the received signal is quantized by an analog-to-digital converter (ADC) so that complex signal processing can be performed in the digital domain. A delta-sigma modulator is commonly used. It can be easily realized using low-cost CMOS processes, such as the processes used to produce digital integrated circuits. However, an input signal is usually very faint. Therefore, gain amplifiers are used to provide proper inputs for a better performance of the modulator.

A gain amplifier being able to amplify a wide dynamic range of analog input signals is desired. Multiple stage programmable gain amplifiers were invented for this purpose. Take a high gain 2-stage operational amplifier for example. It will have bandwidth up to 3 dB. According to different specific feedback factor and phase margin in a closed-loop configuration, the design of wide range programmable gain amplifiers is very difficult to keep stable for 'wide range'. Another problem usually met in use of ADC is noise. For higher resolution ADC, the error source comes from noise. For lower resolution ADC, the major noise is flicker noise of the operational amplifier. Meanwhile, an offset voltage always exists due to mismatch of the circuit design. Power consumption is also disproportionate in multiple stage amplifiers. Many inventions were invented to solve or eliminate these problems.

Figure 1:
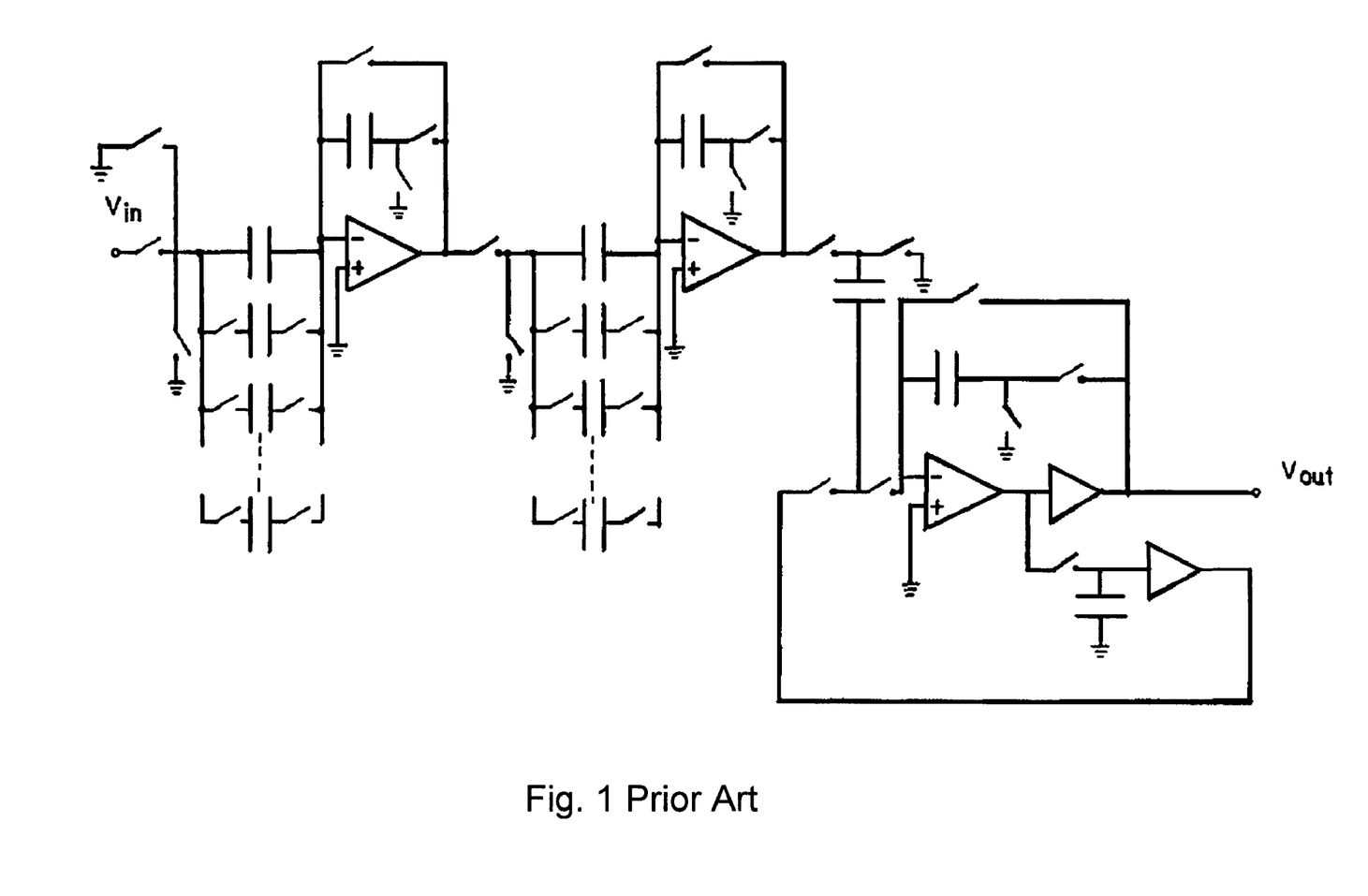
FIG. 1 illustrates a conventional multiple stage programmable gain amplifier.

Please see FIG. 1. U.S. Pat. No. 4,438,354 provides a solution to eliminate the inherent offset voltages of the operational amplifiers contained within the circuit. Offset voltages from other causes, including parasitic capacitances, switch operation, and leakage currents are also eliminated.

Figure 2:
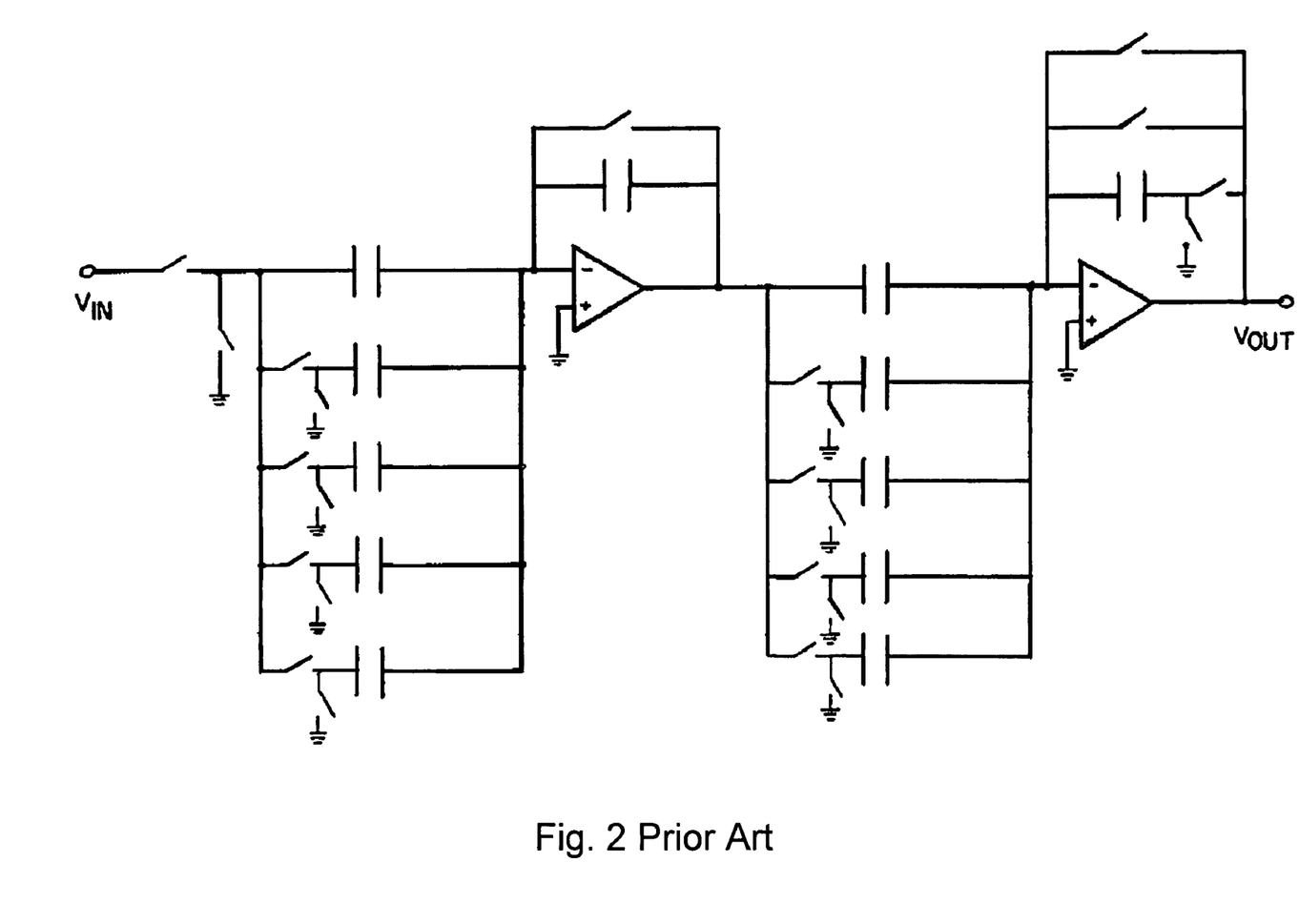
FIG. 2 illustrates another conventional multiple stage programmable gain amplifier.

FIG. 2 shows invention of U.S. Pat. No. 4,555,668. The gain amplifier reduces offset voltage by delaying the phase of clock in the second stage. Two gain stages reduce the total capacitance ratio between input capacitors and feedback capacitor to achieve a desired total gain.

Figure 3:
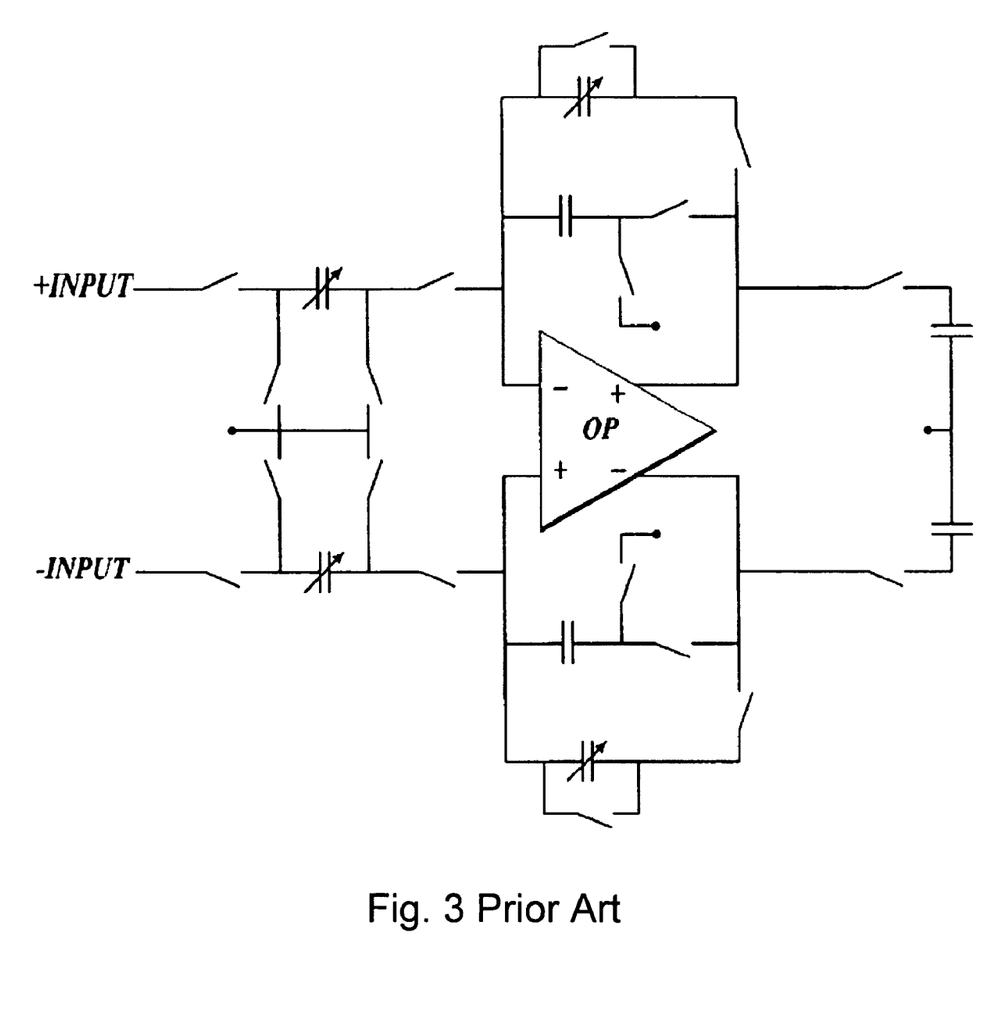
FIG. 3 illustrates a conventional wide gain range and gain step programmable gain amplifier.

U.S. Pat. No. 6,661,283 illustrated in FIG. 3 is a single stage programmable gain amplifier. The '283 patent has advantages to reduce power dissipation and thermal noise.

Figure 4:
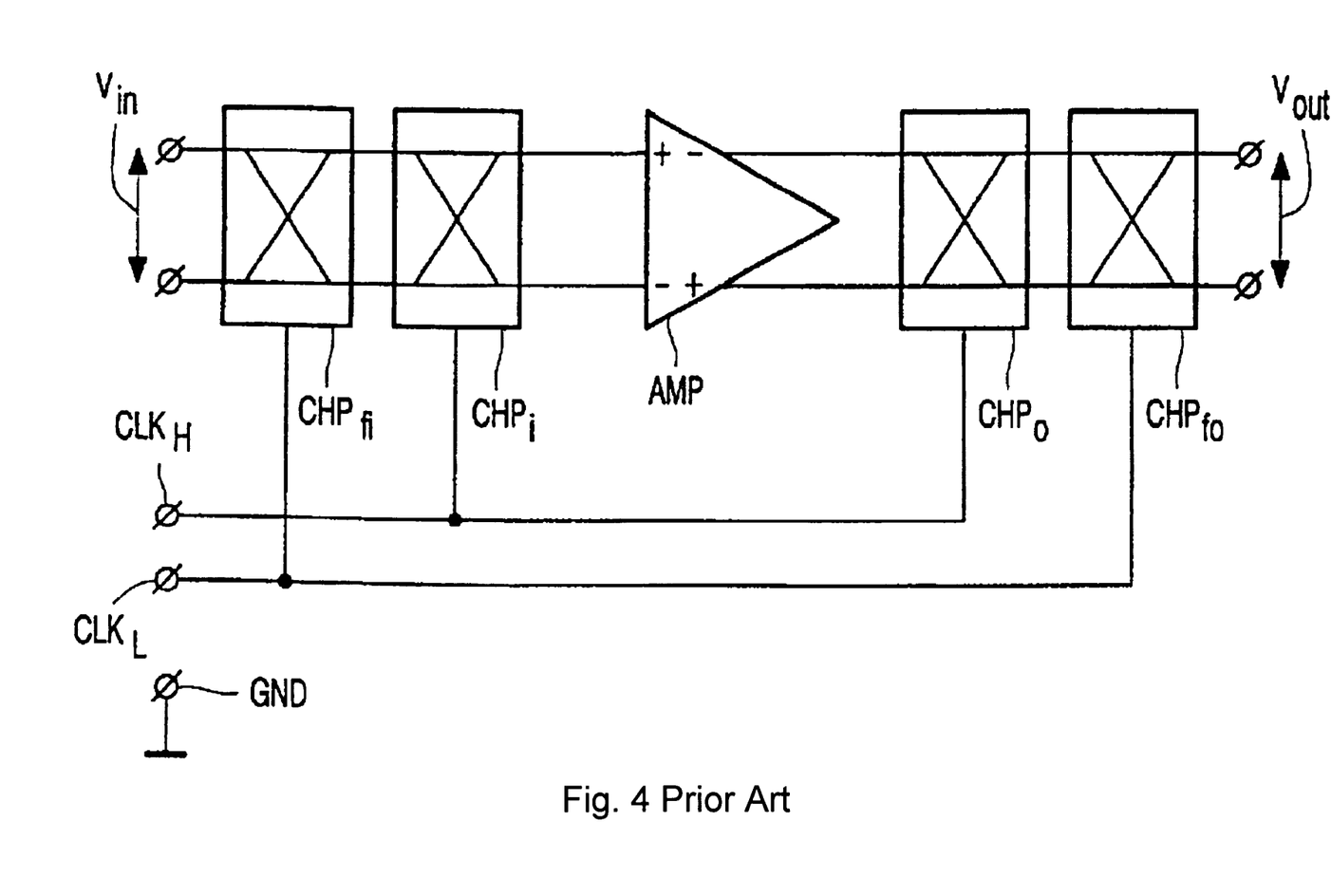
FIG. 4 illustrates a conventional circuit for reducing the DC-offset and the noise produced by an amplifier by two pairs of choppers.
Figure 5:
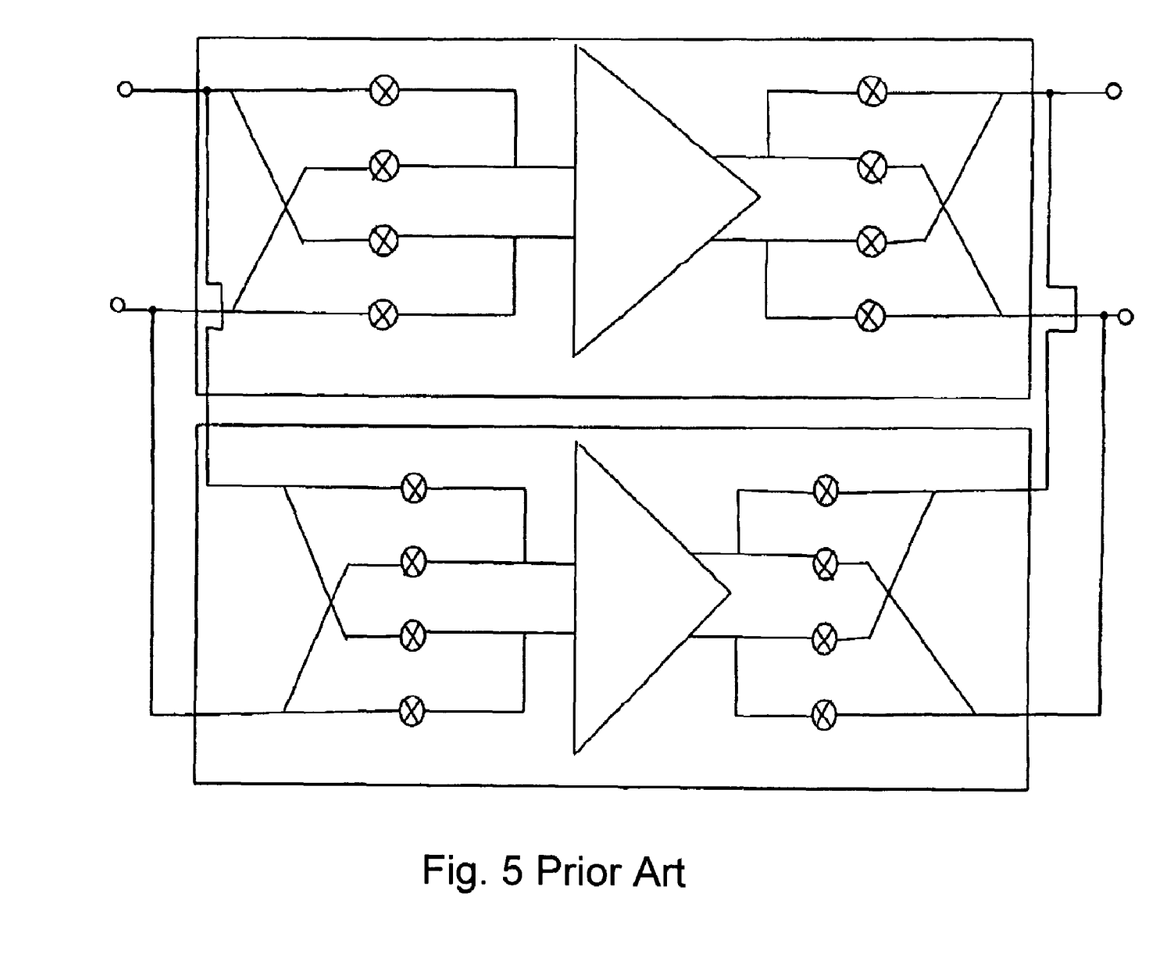
FIG. 5 illustrates a conventional segmented chopping amplifier.

U.S. Pat. No. 6,262,626 shown in FIG. 4 and U.S. Pat. No. 7,224,216 shown in FIG. 5 utilize chopper technique. Usually, chopping techniques for amplifiers have been utilized to modulate the offset and the 1/f noise to higher frequency. With low pass filter, the offset and the 1/f noise can be ideally removed. The '626 patent uses a pair of choppers to reduce the DC-offset and noise caused by amplifier. The '216 patent uses at least two chopping amplifier stages. The effect of the '216 patent can resolve open loop problem, avoid the runaway situation, and reduce aliasing of noise to the frequency baseband and the magnitude of chopping artifacts.

Although these inventions solve some of the problems mentioned above, there is no one able to have a total solution.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a programmable gain amplifier has a first gain stage and a second gain stage.

The first gain stage has a first variable capacitor coupled to a first input signal, a second variable capacitor coupled to a second input signal, a first operational amplifier having a first input node linked to the first variable capacitor and a second input node linked to the second variable capacitor, for amplifying the first input signal and the second input signal as a first intermediate signal and a second intermediate signal, and outputting the first intermediate signal and the second intermediate signal to a first output node and a second output node, respectively, a first fixed capacitor linked to the first variable capacitor and the first output node, a first switch linked to the first variable capacitor and the first output node, a second fixed capacitor linked to the second variable capacitor and the second output node, and a second switch linked to the second variable capacitor and the second output node.

The second gain stage has a third variable capacitor coupled to the first output node, a fourth variable capacitor coupled to the second output node, a second operational amplifier having a third input node linked to the third variable capacitor and a fourth input node linked to the fourth variable capacitor, for amplifying the first intermediate signal and the second intermediate signal as a first output signal and a second output signal, and outputting the first output signal and the second output signal to a third output node and a fourth output node, respectively, a third operational amplifier having a fifth input node linked to the third variable capacitor and a sixth input node linked to the fourth variable capacitor, amplifying the first intermediate signal and the second intermediate signal as a third output signal and a fourth output signal, and outputting the third output signal and the fourth output signal to a third output node and a fourth output node, respectively, a third fixed capacitor linked to the third variable capacitor and the third output node, and a fourth fixed capacitor linked to the fourth variable capacitor and the fourth output node.

Preferably, the programmable gain amplifier has a first multiplexer for multiplexing the second optional amplifier and the third optional amplifier in the second gain stage.

Preferably, the programmable gain amplifier has a second multiplexer for feeding the first input signal and the second input signal to the third variable capacitor and the fourth variable capacitor and bypassing the first gain stage when low gain is needed.

Preferably, the first input signal is linked to the third variable capacitor and the second input signal is linked to the fourth variable capacitor when the first stage is bypassed.

Preferably, the first variable capacitor and the second variable capacitor have a first capacitance value, and the first fixed capacitor and the second fixed capacitor have a second capacitance value.

Preferably, the first gain stage has a first gain factor determined by a ratio of the first capacitance value to the second capacitance value.

Preferably, the third variable capacitor and the fourth variable capacitor have a third capacitance value, and the third fixed capacitor and the fourth fixed capacitor have a fourth capacitance value.

Preferably, the second gain stage has a second gain factor determined by a ratio of the third capacitance value to the fourth capacitance value.

Preferably, the programmable gain amplifier has a first input chopper arranged between the first and second input signals and the first and second variable capacitors, a first output chopper arranged between the first and second output nodes and the third and fourth variable capacitors, a second input chopper arranged between the third and fourth variable capacitors and the third to sixth input nodes, and a second output chopper arranged between the third and fourth output nodes and the third and fourth variable capacitors.

Preferably, the first input chopper is synchronized with the first output chopper by a first chopper clock and the second input chopper is synchronized with the second output chopper by a second chopper clock.

Preferably, the first chopper clock and the second chopper clock has a phase delay.

Preferably, the phase delay is $3/4\pi$.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENTS

The present invention will now be described more specifically with reference to the following embodiments. It is to be noted that the following description of preferred embodiments of this invention is presented herein for purpose of illustration and description only. It is not intended to be exhaustive or to be limited to the precise forms disclosed.

Figure 6:
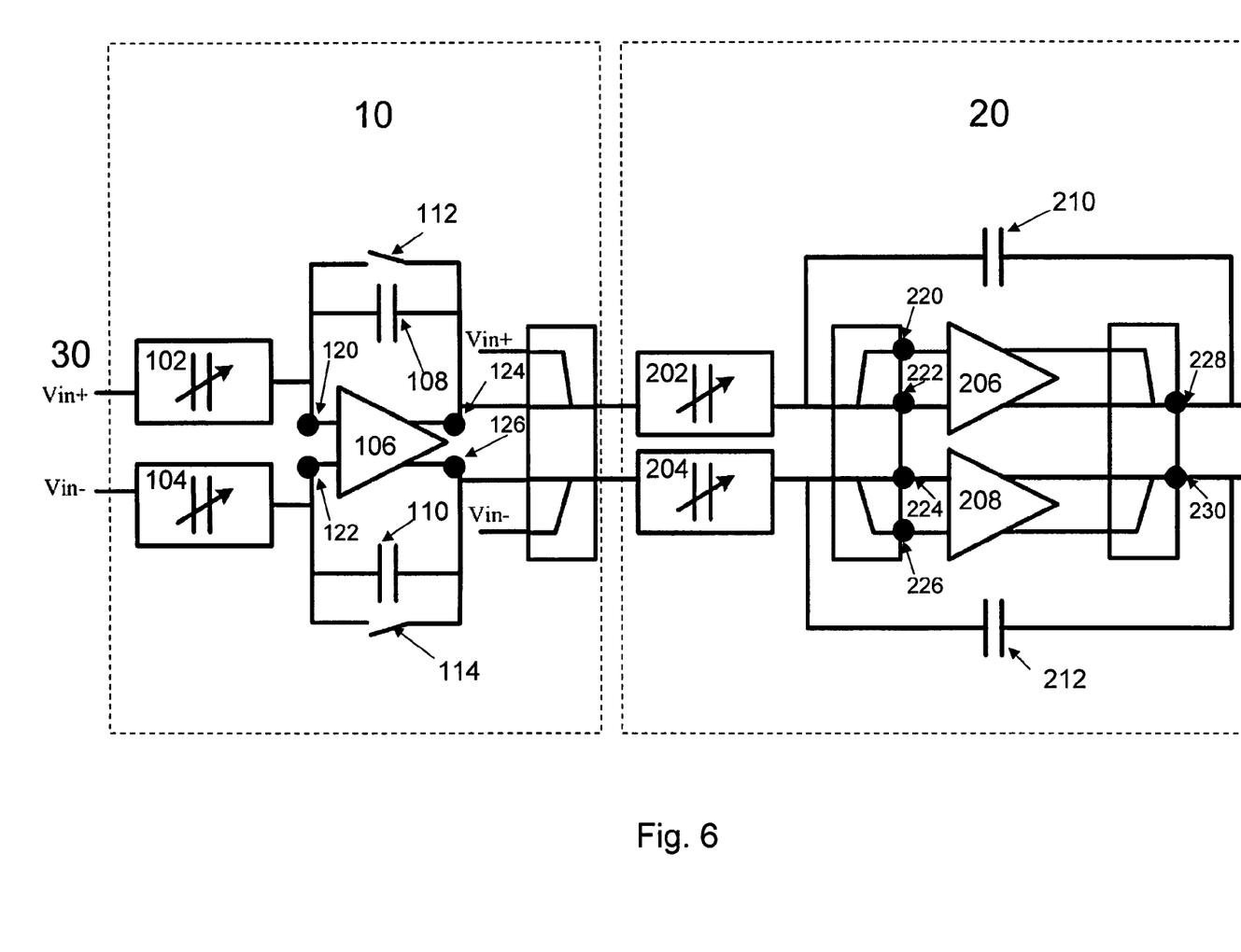
FIG. 6 illustrates a first embodiment of a wide range and high resolution programmable gain amplifier according to the present invention.

Please refer to FIG. 6. It shows a schematic view of a first embodiment in this invention. A programmable gain amplifier has a first gain stage 10 and a second gain stage 20.

Components in the first gain stage 10 are illustrated below. A first input signal source 30 provides a positive voltage Vin+ and a negative voltage Vin− to be amplified. A first variable capacitor 102 is coupled with the voltage Vin+. A second variable capacitor 104 is coupled with the voltage Vin−. A first operational amplifier 106 has a first input node 120, a second input node 122, a first output node 124 and a second output node 126. The first operational amplifier 106 is linked with the first variable capacitor 102 via the first input node 120 and the second variable capacitor 104 via the second input node 122. A first fixed capacitor 108 is linked to the first variable capacitor 102 and the first output node 124. A first switch 112 is linked to the first variable capacitor 102 and the first output node 124. A second fixed capacitor 110 is linked to the second variable capacitor 104 and the second output node 126. A second switch 114 is linked to the second variable capacitor 104 and the first output node 126.

Components in the second gain stage 20 are illustrated below. A third variable capacitor 202 is coupled with the first output node 124. A fourth variable capacitor 204 is coupled with the second output node 126. A second operational amplifier 206 has a third input node 220, a fourth input node 222, a third output node 228 and a fourth output node 230. A third operational amplifier 208 has a fifth input node 224, a sixth input node 226, a third output node 228 and a fourth output node 230. The second operational amplifier 206 is linked with the third variable capacitor 202 via the third input node 220 and the fourth variable capacitor 204 via the fourth input node 222. The third operational amplifier 208 is linked with the third variable capacitor 202 via the fifth input node 224 and the fourth variable capacitor 204 via the sixth input node 226. A third fixed capacitor 210 is linked to the third variable capacitor 202 and the third output node 228. A fourth fixed capacitor 212 is linked to the third variable capacitor 202 and the fourth output node 230.

In this design, there are 256 gain steps. The maximum gain is 128 and the minimum gain is $1/4$. The first gain stage 10 has gain from 2 to 8 and 2-bit resolution. The second gain stage 20 has gain from $1/4$ to 16 and 7-bit resolution. Here, wider gain range corresponds to higher resolution. For low gain, the first gain stage 10 is not necessary. The first operational amplifier 102 is turned off to save power. The second gain stage can provides gain from $1/4$ to 16 by taking the first gain as 1 when the first gain stage 10 is off. The input signal source 30 bypasses the first gain stage 10 and provides voltages to the second gain stage 20.

A multiplexer (not shown) can be used to provide the switch function. The second operational amplifier 206 has a gain ranged from $1/4$ to 2 and the third operational amplifier 208 has a gain ranged from 2 to 8. Therefore, when either one is used, the other can be turned off to save power.

In a second embodiment, chopper technique is applied. Please refer to FIG. 7. A programmable gain amplifier has a first gain stage 60, a second gain stage 70, a first input chopper circuit 616, a first output chopper circuit 618, a second input chopper circuit 714 and a second output chopper circuit 716.

Figure 7:
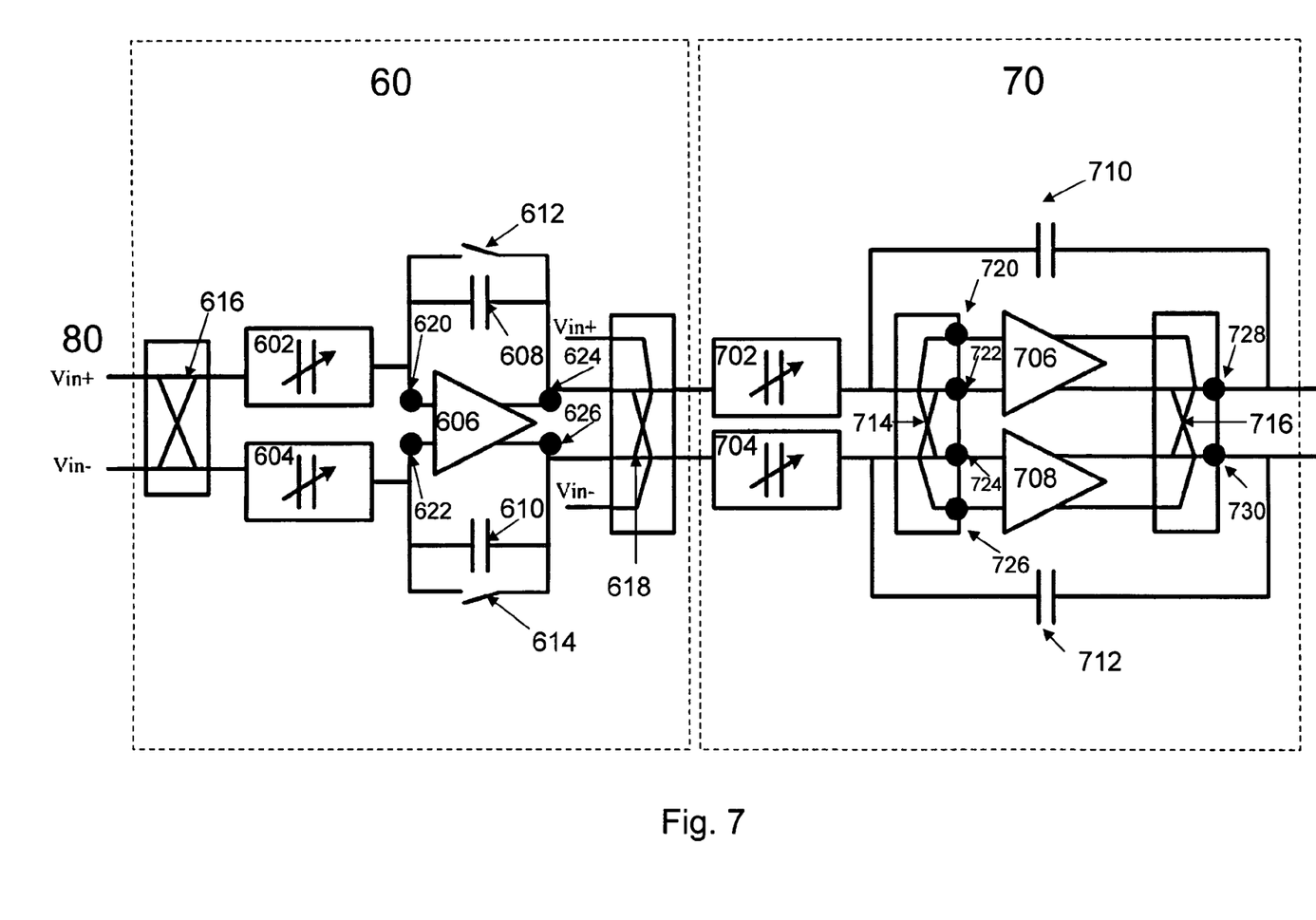
FIG. 7 illustrates a second embodiment of a wide range and high resolution programmable gain amplifier according to the present invention.

Components in the first gain stage 60 are illustrated below. A first input signals source 80 provides a positive voltage Vin+ and a negative voltage Vin− to be amplified. A first variable capacitor 602 is coupled with the voltage Vin+. A second variable capacitor 604 is coupled with the voltage Vin−. A first operational amplifier 606 has a first input node 620, a second input node 622, a first output node 624 and a second output node 626. The first operational amplifier 606 is linked with the first variable capacitor 602 via the first input node 620 and the second variable capacitor 604 via the second input node 622. A first fixed capacitor 608 is linked to the first variable capacitor 602 and the first output node 224. A first switch 612 is linked to the first variable capacitor 602 and the first output node 624. A second fixed capacitor 610 is linked to the second variable capacitor 604 and the second output node 626. A second switch 614 is linked to the second variable capacitor 604 and the first output node 626.

Components in the second gain stage 70 are illustrated below. A third variable capacitor 702 is coupled with the first output node 624. A fourth variable capacitor 704 is coupled with the second output node 626. A second operational amplifier 706 has a third input node 720, a fourth input node 722, a third output node 728 and a fourth output node 730. A third operational amplifier 708 has a fifth input node 724, a sixth input node 2726, a third output node 728 and a fourth output node 730. The second operational amplifier 706 is linked with the third variable capacitor 702 via the third input node 720 and the fourth variable capacitor 704 via the fourth input node 722. The third operational amplifier 708 is linked with the third variable capacitor 702 via the fifth input node 724 and the fourth variable capacitor 704 via the sixth input node 726. A third fixed capacitor 710 is linked to the third variable capacitor 702 and the third output node 728. A fourth fixed capacitor 712 is linked to the third variable capacitor 702 and the fourth output node 730.

The first input chopper circuit 616 is configured between the input signal source 80 and the variable capacitors (the first variable capacitor 602 and the second variable capacitor 604) in the first gain stage. Synchronized with the first input chopper circuit 616, the first output chopper circuit 618 is configured between the output nodes (the first output node 624 and the second output node 626) in the first gain stage and the variable capacitors (the third variable capacitor 702 and the fourth variable capacitor 704) in the second gain stage. The second input chopper circuit 714 is configured between the variable capacitors (the third variable capacitor 702 and the fourth variable capacitor 704) and the input nodes (the third input node 720, the fourth input node 722, the fifth input node 724 and the sixth input node 726) in the second gain stage. Synchronized with the second input chopper circuit 714, the second output chopper circuit 716 is configured between the output nodes (the third output node 728 and the fourth output node 730) and the variable capacitors (the third variable capacitor 706 and the fourth variable capacitor 708).

In this design, there are 256 gain steps. The maximum gain is 128 and the minimum gain is ½. The first gain stage 60 has gain from 2 to 8 and 2-bit solution. The second gain stage 70 has gain from ¼ to 16 and 6-bit solution. Here, wider gain range corresponds to higher resolution. For low gain, the first gain stage 60 is not necessary. The first operational amplifier 606 is turned off to save power. The second gain stage can provides gain from ¼ to 16 by taking the first gain as 1 when the first gain stage 60 is off. The input signal source 80 bypasses the first gain stage 60 and provides voltages to the second gain stage 70.

A multiplexer (not shown) can be used to provide the switch function. The second operational amplifier 706 has a gain ranged from ¼ to 2 and the third operational amplifier 708 has a gain ranged from 2 to 16. Therefore, when either one is used, the other can be turned off to save power.

Figure 8:
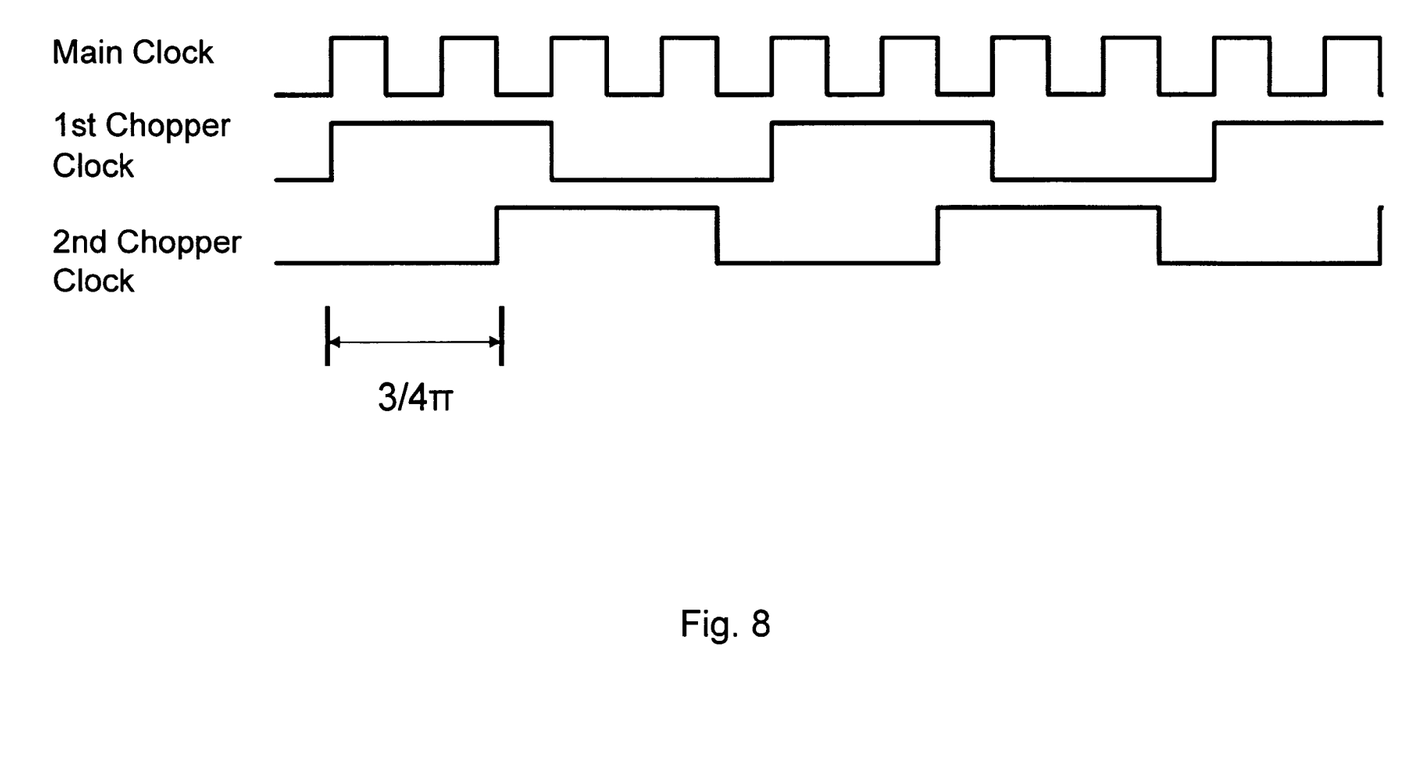
FIG. 8 illustrates chopper clocks in the second embodiment of the wide range and high resolution programmable gain amplifier.

Chopper technique can shift flicker noise to high frequency. A phase delay of ¾π (full cycle of a clock is 2π) is introduced between clock of the first input and output chopper circuits and the clock of the second input and output chopper circuits. Please refer to FIG. 8. Comparing with main clock, frequency of the chopped clock is just ¼ of that of the main clock. The phase delay for the clock of the second input and output chopper circuits makes the chop clock edge happen only after sampling of the input signals. Therefore, the offset and the 1/f noise are shifted to higher frequency.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are accorded with the broadest interpretation so as to encompass all such modifications and similar structures.

What is claimed is:

1. A programmable gain amplifier, comprising,
   a first gain stage comprising,
      a first variable capacitor coupled to a first input signal;
      a second variable capacitor coupled to a second input signal;
      a first operational amplifier having a first input node linked to the first variable capacitor and a second input node linked to the second variable capacitor, for amplifying the first input signal and the second input signal as a first intermediate signal and a second intermediate signal, and outputting the first intermediate signal and the second intermediate signal to a first output node and a second output node, respectively;
      a first fixed capacitor linked to the first variable capacitor and the first output node;
      a first switch linked to the first variable capacitor and the first output node;
      a second fixed capacitor linked to the second variable capacitor and the second output node; and
      a second switch linked to the second variable capacitor and the second output node; and
   a second gain stage comprising,
      a third variable capacitor coupled to the first output node;
      a fourth variable capacitor coupled to the second output node;
      a second operational amplifier having a third input node linked to the third variable capacitor and a fourth input node linked to the fourth variable capacitor, for amplifying the first intermediate signal and the second intermediate signal as a first output signal and a second output signal, and outputting the first output signal and the second output signal to a third output node and a fourth output node, respectively;
      a third operational amplifier having a fifth input node linked to the third variable capacitor and a sixth input node linked to the fourth variable capacitor, amplifying the first intermediate signal and the second intermediate signal as a third output signal and a fourth output signal, and outputting the third output signal and the fourth output signal to a third output node and a fourth output node, respectively;
      a third fixed capacitor linked to the third variable capacitor and the third output node; and
      a fourth fixed capacitor linked to the fourth variable capacitor and the fourth output node.

2. The programmable gain amplifier according to claim 1 further comprising a first multiplexer for multiplexing the second optional amplifier and the third optional amplifier in the second gain stage.

3. The programmable gain amplifier according to claim 1 further comprising a second multiplexer for feeding the first input signal and the second input signal to the third variable capacitor and the fourth variable capacitor and bypassing the first gain stage when low gain is needed.

4. The programmable gain amplifier according to claim 3, wherein the first input signal is linked to the third variable capacitor and the second input signal is linked to the fourth variable capacitor when the first stage is bypassed.

5. The programmable gain amplifier according to claim 1, wherein the first variable capacitor and the second variable capacitor have a first capacitance value, and the first fixed capacitor and the second fixed capacitor have a second capacitance value.

6. The programmable gain amplifier according to claim 5, wherein the first gain stage has a first gain factor determined by a ratio of the first capacitance value to the second capacitance value.

7. The programmable gain amplifier according to claim 1, wherein the third variable capacitor and the fourth variable capacitor have a third capacitance value, and the third fixed capacitor and the fourth fixed capacitor have a fourth capacitance value.

8. The programmable gain amplifier according to claim 7, wherein the second gain stage has a second gain factor determined by a ratio of the third capacitance value to the fourth capacitance value.

9. The programmable gain amplifier according to claim 1, further comprising,
   a first input chopper arranged between the first and second input signals and the first and second variable capacitors;
   a first output chopper arranged between the first and second output nodes and the third and fourth variable capacitors;
   a second input chopper arranged between the third and fourth variable capacitors and the third to sixth input nodes; and
   a second output chopper arranged between the third and fourth output nodes and the third and fourth variable capacitors.

10. The programmable gain amplifier according to claim 9, wherein the first input chopper is synchronized with the first output chopper by a first chopper clock and the second input chopper is synchronized with the second output chopper by a second chopper clock.

11. The programmable gain amplifier according to claim 10, wherein the first chopper clock and the second chopper clock has a phase delay.

12. The programmable gain amplifier according to claim 11, wherein the phase delay is $\frac{3}{4}\pi$.

* * * * *